United States Patent [19]
Lipschutz

[11] Patent Number: 4,500,945
[45] Date of Patent: Feb. 19, 1985

[54] DIRECTLY SEALED MULTI-CHIP MODULE

[75] Inventor: Lewis D. Lipschutz, Poughkeepsie, N.Y.

[73] Assignee: International Business Machines Corporation, Armonk, N.Y.

[21] Appl. No.: 401,186

[22] Filed: Jul. 23, 1982

[51] Int. Cl.³ .............................................. H05K 7/20
[52] U.S. Cl. ..................................... 361/386; 361/395
[58] Field of Search ........................... 357/79, 81, 82; 165/80 B, 80 C, 185; 361/382, 381, 385, 386, 361/388, 395, 399, 383

[56] References Cited
U.S. PATENT DOCUMENTS
4,381,032 4/1983 Cutchaw ............................. 165/185

OTHER PUBLICATIONS
"Thermally Enhanced-Structure", Coughlin, IBM Tech. Discl. Bull., vol. 21, No. 1, Jun. 1978, p. 185.
"Thermal Conduction Module", Blodgett, IBM Tech. Discl. Bull., vol. 26, No. 1, Jan. 1982, pp. 30–36.
"High Capacity Power-Package", Doo, IBM Tech. Discl. Bull., vol. 21, No. 5, Oct. 1978, pp. 1898, 1899.
"Integrated Module Heat Exchanger", Antonetti, IBM Tech. Discl. Bull., vol. 20, No. 11A, Apr. 1978, p. 4498.
"Device Cooling", Johnson, IBM Tech. Discl. Bull., vol. 20, No. 10, Mar. 1978, p. 3919.
"Silicon Heat Sink-Temperatures", Ahearn, IBM Tech. Discl. Bull., vol 21, No. 8, Jan. 1979, pp. 3378–3380.

Primary Examiner—G. P. Tolin
Attorney, Agent, or Firm—John F. Ohlandt; T. R. Coca; J. Jancin, Jr.

[57] ABSTRACT

A hermetic compression sealing system with a semiconductor, multi-chip thermal conduction module, involving a ceramic substance which includes interconnected semi-conductor chips containing integrated circuits defining the module; an arrangement is provided for directly sealing the module involving a compression seal which is in direct bearing contact with the substrate, a cover in direct bearing contact with the compression seal, and a clamping plate for holding the cover, compression seal and ceramic substrate in sealing arrangement, thereby forming a sealed chamber surrounding the module; a gas charge, such as of helium or the like, within the chamber enables conducting heat from the semi-conductor chips of the ambient.

9 Claims, 3 Drawing Figures

DIRECTLY SEALED MULTI-CHIP MODULE

BACKGROUND OF THE INVENTION

1. Field of the Invention

This invention relates to semiconductor integrated circuits, and more particularly, to the packaging and efficient cooling of multi-chip modules comprising a multi-layer ceramic substrate on which are mounted and interconnected an assemblage of semiconductor chips.

2. Background Information

In order to place the present invention in proper context and to provide a complete background for understanding its important features and advantages, reference may be made to an article in the IBM Journal of Research and Development, Volume 26, No. 1 of January 1982 by Blodgett and Barbour. There is described in that article, which is incorporated herein by reference, a recently developed thermal conduction module (TCM) which, in essence, involves a multi-layer ceramic package which provides for efficient cooling of a large number of integrated circuits embedded in semiconductor chips which are suitably interconnected and form part of said module.

The described thermal conduction module represents a breakthrough in high-performance package design and concept. Its significance lies in its ability to provide large scale integration (LSI) capability in the so called first level package, thereby allowing the advantages in cost, performance, and reliability already achieved at the chip level to be realized at the package level. It is extremely important to be able to produce large, complex, tight tolerance, multi-layer ceramic structures so as to provide the required LSI interconnection capability, high performance wiring and power distribution. However, the crucial factor in achieving these objectives is a cooling scheme which can overcome the thermal limitation which has so far stood in the way of high performance LSI at the package level. To understand the heat dissipation requirements, which are approximately 300 watts, it must be appreciated that a typical thermal conduction module, as described in the cited article, includes 100 chips containing 25,000 logic circuits and 65,000 bits of storage. Furthermore, the module is provided with 1800 pins to interface with a second level package.

A further critical aspect of the thermal conduction module design and construction is the ability to re-work the assembly so as to be able to make engineering changes. Thus, it must be possible to break the helium seal so that individual chips can be replaced and wires can be deleted. Such a feature is essential during the design and de-bug phase of system development.

SUMMARY OF THE INVENTION

The present invention retains the features already discussed of the thermal conduction module system. That is to say, it retains the efficient cooling ability, thereby fulfilling the aforenoted requirements for large scale integrated chips; further, it provides requisite re-workability of the assembly while insuring resistance to leakage of the gas charge within the cooling chamber.

Accordingly, the present invention is directed to an improvement in the compression sealing for the multi-chip thermal conduction module.

A primary object of the present invention is to provide a compression sealing arrangement which is simple, inexpensive and insures the hermeticity of the seal.

Another primary object is to increase the effective or usable area for the placement of semiconductor chips on a substrate.

The above objects are fulfilled by a principal feature of the present invention comprising an arrangement for directly sealing a module; that is, for forming the requisite sealed chamber by clamping the compression seal directly to the substrate between the cover and clamping plate used for this purpose. This is done rather than following standard practice which involves clamping a supporting frame between the cover and clamping plate. Such standard practice also involves the brazing of the supporting frame to the ceramic substrate; specifically, a flange forming part of that frame is so brazed, the other flange of that frame being in contact with the compression seal, which abuts the cover.

Accordingly, the complete sealing system of the invention resides in the combination comprising: a ceramic substrate including interconnected semiconductor chips containing integrated circuits defining said module; means for directly sealing said module, said means including the compression seal, a cover or cooling "hat", the latter immediately abutting or contacting the compression seal, and a clamping plate for holding the cover, compression seal and substrate in sealing engagement, thereby forming a sealed chamber substantially surrounding said module; further comprising means for conducting heat from the semiconductor devices to the ambient, including a gas charge, preferably helium, within said chamber, the means for directly sealing said module preventing leakage of the gas to the ambient.

Another feature of the present invention resides in the provision for substantially reducing the thickness of the marginal or peripheral portion of the ceramic substrate. This is done in order to maintain the projection dimensions imposed on the connecting pins involved (which typically number eighteen hundred) so that compatibility will be preserved with a second level package to which the first level package is connected. This feature and its attendant advantages will become apparent from the detailed description. However, as will be understood, it is not absolutely critical that the standard or conventional pin projection dimensions be maintained. Therefore, if it is found desirable to change them, the corresponding dimensions of the clamping or base plate would be suitably altered.

A fortuitous feature of the present invention derives from the fact that, as a consequence of grinding down the marginal portions of the ceramic substrate, it has been found that a glassy film is produced, which aids substantially in promoting effective sealing of the module.

Despite the advantages which will be herewith understood as flowing from the concept of the present invention, the direct sealing principle was not immediately adopted in connection with the manufacture of thermal conduction modules. This is because it was believed that the substrate would break under the substantial clamping force involved (total force of 7000 pounds or 400 pounds per inch of seal). Also, it was thought that because of the somewhat porous character of the ceramic material, the gas, such as helium, contemplated for use would leak from the sealed chamber. However, despite the pressure of approximately 1.6 atmospheres for such gas, there has been no serious problem of leakage. In fact, the direct seal arrangement performs better than the indirect or standard approach. This is substantiated by test data furnished hereinafter.

Another prospective problem that appeared to be difficult was that which occurs in the event of providing the aforesaid compatibility, i.e., where the terminal pins are required to extend to the same extent as with the conventional TCM package. In such case, the thickness of the lip or flange on the clamping plate has to be reduced for the present configuration. However, the reduced thickness has not presented a serious problem.

It should be noted that it has been known heretofore to provide direct sealing of semiconductor chip packaging structures. See, for example, IBM Technical Bulletin Vol. 21, No. 1 of June 1978 in which there is disclosed a sealing element in contact with a ceramic substrate and held between clamped members which define a cooling assembly for semiconductor chips. However, in this reference, there is no requirement for sealing a gas charge. Instead, a controlled volume of grease serves as the cooling medium.

As noted previously, the outstanding advantage accruing to the present invention is that one is enabled to obtain more "real estate" for a given assembly or package size. In other words, more usable area becomes available on the ceramic substrate. The original stimulus for the implementation of the present invention was the reduction in cost because of the savings involved in dispensing with the use of highly priced gold in plating the standard frame, and for the braze material which joins the frame to the ceramic substrate. That cost reduction stimulus, although it is substantial, has been overshadowed by the gain in "real estate".

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
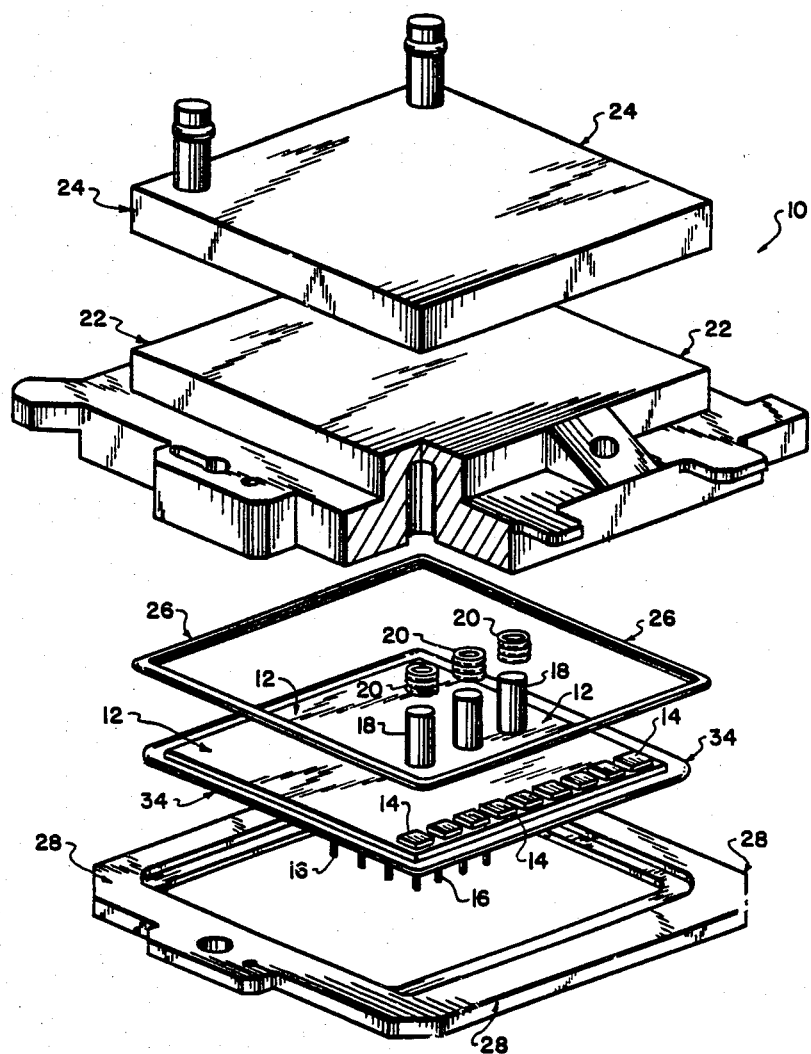
FIG. 1 is an exploded view of the conventional or standard thermal conduction module.
Figure 2:
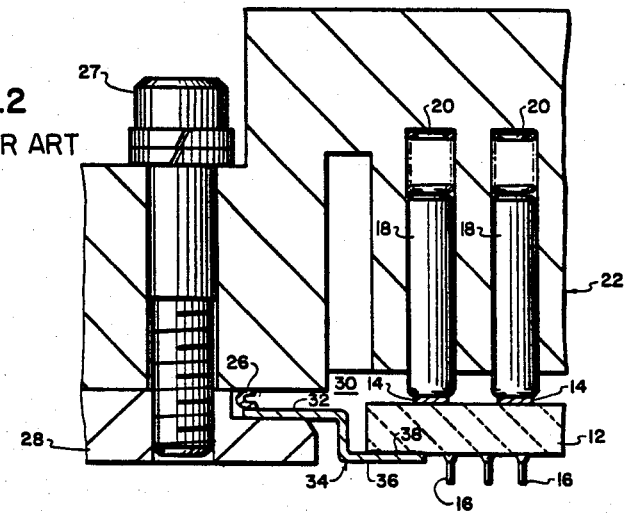
FIG. 2 is a fragmentary illustration in cross section of the principal parts of the thermal conduction module seen in FIG. 1.

Referring now to the figures of the drawing, and particularly to FIGS. 1 and 2 thereof, there will be seen the essential components of a thermal conduction module. The total assembly 10 is shown schematically in an exploded view and includes, in one example, a 90 mm.$^2$ multilayer ceramic substrate 12 capable, in accordance with the prior art, of providing power distribution and wiring for up to one hundred logic chips 14, or a combination of 118 logic or array chips. For the purpose of connecting to the next-level package which will be referred to as the second level, 1800 pins are provided. Several of these pins 16 are illustrated in FIG. 1. Pistons 18, biased by means of springs 20 so as to contact the back of each chip, provide the main thermal path to a water cooled housing comprising a cover or "hat" 22 and a cold plate 24, the latter having suitable chambers for circulation of the water. Both the cover 22 and cold plate 24 are preferably made of aluminum.

In accordance with this prior art construction, a C-ring 26 of lead coated Inconel steel serves as a compression seal, being clamped, by use of bolts 27, between the cover 22 and a flange 32 forming part of a frame 34. The cover 22, together with the clamping or base plate 28 of stainless steel, defines a chamber 30. Another flange 36 is formed at the inner periphery of frame 34, this flange being brazed at 38 to the substrate 12, thereby sealing the assembly.

The ceramic formulation for the substrate 12, consisting of approximately 90% alumina and 10% glass, is selected on the basis of strength requirements, sintering characteristics, and shrinking compatibility with the molybdenum metallurgy.

The 90 mm.$^2$ substrate 12 consists of up to 33 molybdenum-metallized alumina layers which are required for power distribution, for impedance controlled interconnection of up to twelve thousand chip pads and for wiring to the eighteen hundred module pins. A typical substrate contains 350,000 vias for layer-to-layer connections and 130 meters of X-Y wiring. The total substrate thickness of the substrate 12 seen in FIGS. 1 and 2 is typically about 5.5 millimeters.

The design features relating to the routing of signal connections from an individual chip 14 through the uppermost layers in the substrate 12 to an array of surface pads which in turn are connected to internal wiring layers can be appreciated by reference to the cited article in the IBM Journal of Research and Development, such details not being necessary to an appreciation of the present invention.

However, it remains important that the ability be preserved to delete connections to internal layers and this is afforded by the present invention. Thus, connections can be deleted to a given chip, and a surface discrete wire can be substituted when a wiring change is needed. This discrete wires are ultrasonically bonded to the gold-plated pads (not seen).

Figure 3:
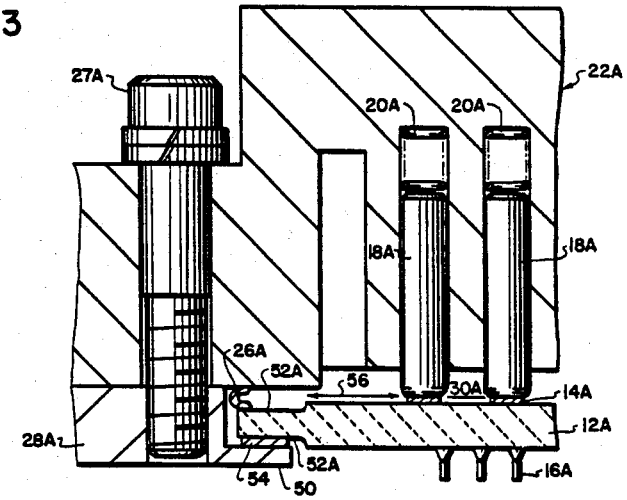
FIG. 3 is a fragmentary illustration in cross-section of an embodiment of a thermal conduction module in accordance with the present invention, in which substantially the same configuration as in FIG. 1 is involved for most of the constituents; however, the module is sealed by clamping the compression seal ring directly to the substrate.

Referring now to FIG. 3, a preferred embodiment of a thermal conduction module in accordance with the present invention is depicted. In this figure, the components that are the same as those in FIGS. 1 and 2 carry the same numerals, except for the addition of the suffix A. However, herein it will be noted that instead of the C-ring 26 being clamped between the cooling hat or cover 22 and the supporting frame 34—in order to seal the entire assembly—the C-ring 26A in FIG. 3 is clamped between the cover 22A and the substrate 12A. Thus, there is direct sealing, rather than indirect sealing by means of the frame 34. What this means in practical terms is that there is more "real estate" available for adding rows and columns of chips to the module.

In the preferred embodiment, as has been noted previously, the purpose of having the pin 16A project to the same extent as in the previously known embodiment in FIG. 2, is so that compatibility will exist with already designed second level packages. Accordingly, the base or clamping plate 28A is now constructed to have a relatively thin horizontal member or lip 50. For the same purposes, i.e., in assuring proper pin extension, the thickness of the substrate 12A is reduced at the marginal or peripheral portions 52A by grinding away material from the top and bottom surfaces.

As has been noted, it has turned out that a glassy film results from the grinding at the surfaces of the marginal portions 52A. This aids in sealing in the helium gas when the C-ring 26A is clamped against the top surface of substrate 12A. In order to reduce localized stresses imposed by the clamping plate 28A on the pin side of the substrate 12A in FIG. 3, a thin (0.25 mm.) lead gasket 54 is used as a cushion.

It will thus be appreciated that compared to other sealing arrangements, that of the present invention is far simpler and less costly. Moreover, since the frame 34 is completely eliminated, any problem with the brazed joint 38 is obviated. However, most importantly, the gain in "real estate" is appreciable. Referring again to FIG. 3, it will be noted that the larger substrate 12A (116 mm.$^2$) takes up substantially the full lateral extension of the frame 34 of FIG. 2. In spite of the fact that the sealing is accomplished directly against the substrate 12A, comparatively little space at the margins 52A is taken up, such that there is a net gain of usable space. Thus, although for purposes of comparison the same piston configuration is shown in FIG. 3 as in FIG. 2 and the same 100 chip layout is depicted, it turns out that, rather than the limited space adjoining the last chip 14 on the left of the substrate 12, there is increased usable space, designated by arrows 56, on the substrate 12A in FIG. 3.

Accordingly, in an extension of the preferred embodiment, the cooling hat or cover 22A can be modified to provide additional pistons 18A in columns and rows corresponding to this increased availability of space on the substrate 12A. With the same outside dimensions for the given package, therefore, this larger substrate 12A could provide at least an extra column and row of additional chips.

In order to enable the man skilled in the art to practice the present invention, a detailed set of specifications with respect to certain components are herewith provided: the substrate 12A has a thickness of approximately 5.5 millimeters or 0.215 inches. The lower marginal portions are ground away to the extent of approximately 0.040 inches and the top marginal portions approximately 0.010 to 0.040 inches, leaving a reduced thickness of approximately 0.150 to 0.120 inches. The C-ring 26A of material already noted is about 0.073 inches thick when squeezed or compressed and 0.100 inches before squeezing.

Comparison test data is herewith presented with respect to tests performed on standard assemblies, as well as on directly sealed assemblies according to the present invention. In the latter case, the substrate 12A is provided with either an unground marginal portion 52A or a ground marginal portion. As noted previously, this grinding operation results in a smeared, glassy film at the marginal portion which is believed to account for the superior sealing evidenced by the data furnished in the table.

| WATERBATH CYCLES TO FAILURE WITH WAXED SEAL RING (25° C.-75° C.) | | |
| --- | --- | --- |
| | Experiment No. | Cycles* |
| STANDARD ASSEMBLIES | 60 | 17000–18300 |
| | 61 | 4300–7100 |
| | 89 | 12800–18300 |
| | 90 | 6500–13500 |
| | 91 | 19000–24100 |

| WATERBATH CYCLES TO FAILURE WITH WAXED SEAL RING (25° C.-75° C.) -continued | | |
| --- | --- | --- |
| | Experiment No. | Cycles* |
| | 110 | 17200–21000 |
| | 111 | 44700→*** |
| | 112 | –0 |
| | 113 | 11900–16300 |
| | 114 | 19500–26300 |
| | 119 | 7700→ |
| DIRECT SEAL (Unground Substrate) | 10 Point Aver. = | 16060 |
| | 82 | 3400–4700 |
| | 88 | 13100–18600 |
| | 92 | 18000–23200 |
| | 94 | 10500–14500 |
| | 95 | –0 |
| DIRECT SEAL (Ground Substrate) | 4 Point Aver. = | 11250 |
| | 96 | 19800–21600 |
| | 103 | –0 |
| | 107 | 37400–42273 |
| | 108 | 23800–30700 |
| | 109 | 23100–30000 |
| | 120 | 32700–36700 |
| | 121 | 51900→ |
| | 124 | 1800–6000** |
| | 125 | 25200–30000 |
| | 7 Point Aver. = | 30560 |

*Hyphenated values are cycles at last good reading and first bad (leaking) reading.
**On disassembly found four fibers across seal.
***Arrows indicate test was stopped without seal failure.

It will be appreciated by those skilled in the art that the primary cause of seal degradation and failure is the repetitive temperature changes between the power-on and power-off state of the module. Accordingly, testing of the seal is done by thermally cycling the modules either in an oven or, more rapidly, in a water bath whose temperature is varied linearly between high and low limits. The comparative test data in the table above results from water bath cycling and shows the number of thermal cycles required to cause seal failure for standard assemblies and directly sealed assemblies made according to the present invention.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention,

I claim:

1. A hermetic compression sealing system with a semiconductor, multi-chip, thermal conduction module comprising:
    (a) a ceramic substrate having a main portion of predetermined thickness and a marginal portion which has a thickness less than said predetermined thickness and including interconnected semiconductor chips containing integrated circuits defining said module;
    (b) means for directly sealing said module, said means including:
        1. a unitary metallic compression seal in direct bearing contact with the marginal portion of the upper surface of said substrate for providing hermetic sealing of a gas charge;
        2. a cover in contact with said compression seal;

3. a clamping plate holding the cover, compression seal and the ceramic substrate in sealing engagement, thereby forming a unitary sealed chamber surrounding said module; said clamping plate having a flange in overlapping relationship with the marginal portion of the lower surface of said substrate;

(c) means for conducting heat from the semiconductor chips to the ambient, including a gas charge within said chamber, the means for directly sealing said module preventing leakage of the gas to the ambient.

2. A system as defined in claim 1, in which said compression seal is in the form of a C-ring constituted of lead-plated steel.

3. A system as defined in claim 1, in which a sealing glass film is present at the marginal portion.

4. A system as defined in claim 3, in which a lead cushion is present between the bottom surface of said substrate and the clamping plate.

5. A system as defined in claim 1, in which said substrate main portion has a total area of 116 mm.$^2$, and a thickness of 5.5 mm.

6. A system as defined in claim 1, in which a cold plate abuts the cover for conducting heat from said module.

7. A system as defined in claim 1, in which said means for conducting heat from said module includes pistons which are spring-biased to contact said individual chips.

8. A system as defined in claim 1, in which helium at approximately 1.6 atmospheres is the gas for aiding in the conduction of heat from said module.

9. A system as defined in claim 1 in which said clamping plate has a ring shape so as to clamp or hold said substrate only at its periphery.

* * * * *

UNITED STATES PATENT AND TRADEMARK OFFICE
CERTIFICATE OF CORRECTION

PATENT NO. : 4,500,945
DATED : February 19, 1985
INVENTOR(S) : LEWIS D. LIPSCHUTZ It is certified that error appears in the above-identified patent and that said Letters Patent is hereby corrected as shown below:

Title Page (Abstract),
    line 3,        "ceramic substance" should read --ceramic substrate--.

Column 4, line 42,      "This discrete wires" should read --The discrete wires--.

Signed and Sealed this

Second Day of July 1985

[SEAL]

Attest:

DONALD J. QUIGG

Attesting Officer    Acting Commissioner of Patents and Trademarks